United States Patent
Kotani

(10) Patent No.: US 8,669,546 B2
(45) Date of Patent: Mar. 11, 2014

(54) NITRIDE GROUP SEMICONDUCTOR LIGHT EMITTING DEVICE INCLUDING MULTIQUANTUM WELL STRUCTURE

(75) Inventor: Yasuhisa Kotani, Anan (JP)

(73) Assignee: Nichia Corporation, Anan-Shi (JP)

( * ) Notice: Subject to any disclaimer, the term of this patent is extended or adjusted under 35 U.S.C. 154(b) by 0 days.

(21) Appl. No.: 13/583,257

(22) PCT Filed: Mar. 3, 2011

(86) PCT No.: PCT/JP2011/054955
§ 371 (c)(1),
(2), (4) Date: Sep. 7, 2012

(87) PCT Pub. No.: WO2011/111606
PCT Pub. Date: Sep. 15, 2011

(65) Prior Publication Data
US 2013/0001512 A1    Jan. 3, 2013

(30) Foreign Application Priority Data
Mar. 8, 2010  (JP) .................................. 2010-050369

(51) Int. Cl.
*H01L 33/04* (2010.01)
(52) U.S. Cl.
USPC .............. 257/17; 257/E33.007; 257/E33.008; 977/950
(58) Field of Classification Search
CPC ......... B82Y 20/00; B82Y 10/00; H01L 33/06
USPC ................. 257/13, 14, 94, 96, E33.008, 9.17, 257/E33.007; 977/932, 950, 761, 755
See application file for complete search history.

(56) References Cited

U.S. PATENT DOCUMENTS 7,915,607 B2 *  3/2011 Lee et al. ........................ 257/14
2002/0053676 A1  5/2002 Kozaki
(Continued)

FOREIGN PATENT DOCUMENTS

JP   08-250807   9/1996
JP   2002-223042   8/2002
(Continued)

OTHER PUBLICATIONS

International Search Report for corresponding International Application No. PCT/JP2011/054955, Apr. 5, 2011.
(Continued)

*Primary Examiner* — Nikolay Yushin
(74) *Attorney, Agent, or Firm* — Ditthavong Mori & Steiner, P.C.

(57) ABSTRACT

A nitride group semiconductor light emitting device includes a substrate, n-type and p-type semiconductor layers, and an active region. The n-type and p-type semiconductor layers are formed on or above the substrate. The active region is interposed between the n-type and p-type semiconductor layers. The active region includes barrier layers that are included in a multiquantum well structure, and an end barrier layer that has a thickness greater than the barrier layer, and is arranged closest to the p-type semiconductor layer. The average thickness of the last two barrier layers that are arranged adjacent to the end barrier layer is smaller than the average thickness of the other barrier layers among the thicknesses of the barrier layers that are included in the multiquantum well structure.

14 Claims, 6 Drawing Sheets

(56) References Cited

U.S. PATENT DOCUMENTS

| | | |
|---|---|---|
| 2006/0108603 A1 | 5/2006 | Uemura et al. |
| 2007/0114540 A1* | 5/2007 | Lee et al. ............ 257/79 |
| 2009/0166668 A1* | 7/2009 | Shakuda ............ 257/103 |
| 2010/0096615 A1 | 4/2010 | Okamoto et al. |
| 2010/0288999 A1* | 11/2010 | Kikuchi et al. ............ 257/13 |
| 2011/0100292 A1 | 5/2011 | Uematsu et al. |

FOREIGN PATENT DOCUMENTS

| | | |
|---|---|---|
| JP | 2003-218396 | 7/2003 |
| JP | 2003-332697 | 11/2003 |
| JP | 2006-108585 | 4/2006 |
| JP | 2008-109066 | 5/2008 |
| JP | 2009-99893 | 5/2009 |
| JP | 2010-42976 | 2/2010 |
| TW | 200929619 | 7/2009 |
| WO | WO 02/05399 | 1/2002 |

OTHER PUBLICATIONS

Chinese Office Action for corresponding CN Application No. 201180013144.5, Nov. 22, 2013.

Japanese Office Action for corresponding JP Application No. 2010-050369, Oct. 22, 2013.

* cited by examiner

US 8,669,546 B2

NITRIDE GROUP SEMICONDUCTOR LIGHT EMITTING DEVICE INCLUDING MULTIQUANTUM WELL STRUCTURE

BACKGROUND OF THE INVENTION

The present invention mainly relates to a semiconductor light emitting device that includes a nitride group semiconductors (e.g., general formula $In_xAl_yGa_{1-x-y}N$ (0≤x, 0≤y, x+y≤1), and a method for producing this semiconductor light emitting device.

Semiconductor light emitting devices that include a light emitting layer between p-type and n-type semiconductor layers have been practically used as light emitting diodes (LED), semiconductor laser diodes (LD), and for lightings that employ the LEDs or LDs, and the like. In particular, since semiconductor light emitting devices that include nitride group materials (hereinafter, occasionally and generically referred to as "GaN") can emit blue or green light, these semiconductor light emitting devices have been energetically researched and developed.

As a method of producing these semiconductor light emitting devices, it is known that GaN is grown on a different material substrate. In this method, after the different material substrate is subjected to a thermal cleaning treatment, a low-temperature buffer layer is grown on the upper surface of the different material substrate. Subsequently, a GaN layer is grown at a high temperature. The purpose of GaN layer growth is to make the substrate surface flat, and to eliminate penetrating pits from the different material substrate. Subsequently, an n-type contact layer is grown which is an n-type-impurity-doped layer and provide an ohmic contact surface onto which an n-side ohmic electrode is formed. Subsequently, a superlattice layer is deposited as a primary layer for an active layer. After that, the active layer is grown.

In this production method, since GaN is grown on the different material substrate, a number of dislocations will extend from the GaN layer through the n-type contact layer and the active layer to the p-type semiconductor layer. In particular, in the case where the active layer includes In, crystal defects present. The crystal defects have relationship with the amount of dislocations from the primary layer. That is, the crystal defects will increase with dislocations. as a result, non-light emission recombination probability will greatly depend on the dislocations.

On the other hand, in order to provide a high intensity and efficient light emitting device, the thickness of a well layer and the number of layers in the active layer are increased (for example, Patent Literatures 1 to 5). For example, according to Patent Literature 1, in an active layer having a semiconductor quantum well structure that includes barrier and well layers, the well layers have different thicknesses whereby emitting light with different wavelengths. In addition, the number of pairs of the barrier and well layers is greater on the p-side semiconductor layer side than the n-side semiconductor layer side. Also, according to Patent Literature 2, the p-type impurity doping amount is small or the p-type impurity is not doped in a p-type semiconductor layer close to the active layer, while a barrier layer that is the closest to the p-type semiconductor layer side is formed thin so that the hole injection efficiency can be improved.

CITATION LIST

Patent Literature

Patent Literature 1: Japanese Patent Laid-Open Publication No. JP 2009-99 893 A

Patent Literature 2: Japanese Patent Laid-Open Publication No. JP 2006-108 585 A Patent Literature 3: Japanese Patent Laid-Open Publication No. JP 2008-109 066 A Patent Literature 4: Japanese Patent Laid-Open Publication No. JP 2003-218 396 A Patent Literature 5: Japanese Patent Laid-Open Publication No. JP 2002-22 3042 A

SUMMARY OF INVENTION

However, if dislocations or defects are once produced, the dislocations or defects cannot be easily reduced. In particular, when a well layer in the active layer is formed thick, or when the number of deposited well layers is increased, the dislocations or defects are likely to further increase. As a result, the light emitting layer will have a number of dislocations or crystal defects. Consequently, high light emission efficiency cannot be obtained. In addition, in this case, when a well layer in the active layer is formed thick, or when the number of deposited well layers is increased, the serial-connection resistance component is increased, which in turn increases forward voltage Vf. Consequently, there is a problem that it will be difficult to achieve high efficiency.

The present invention is aimed at solving the problem. It is a main object of the present invention to provide a light emitting device that can suppress reduction of light emission efficiency resulting from dislocations or crystal defects, and reduce the serial-connection resistance component whereby further improving efficiency.

To solve the above object, a semiconductor light emitting device according to an aspect of the present invention is a nitride group semiconductor light emitting device that includes a substrate, n-type and p-type semiconductor layers, and an active region. The n-type and p-type semiconductor layers are formed on or above the substrate. The active region is interposed between the n-type and p-type semiconductor layers. The active region includes barrier layers, and an end barrier layer. The barrier layers are included in a multiquantum well structure. The end barrier layer has a thickness greater than the barrier layer, and is arranged closest to the p-type semiconductor layer. The average thickness of the last two barrier layers that are arranged adjacent to the end barrier layer is smaller than the average thickness of the other barrier layers among the barrier layers that are included in said multiquantum well structure. According to this construction, the resistance on the p-type semiconductor layer side can be reduced. As a result, the forward voltage can be reduced. Therefore, it is possible to provide an efficient nitride group semiconductor light emitting device.

Furthermore, a semiconductor light emitting device according to another aspect of the present invention is a nitride group semiconductor light emitting device that includes a substrate, n-type and p-type semiconductor layers, and an active region. The n-type and p-type semiconductor layers are formed on or above the substrate. The active region is interposed between the n-type and p-type semiconductor layers. The active region includes barrier layers that are included in a multiquantum well structure. The barrier layers include at least first barrier layers, and a second barrier layer (s). The second barrier layer is/are arranged on the p-type semiconductor layer side relative to the first barrier layer, and has/have a thickness smaller than the first barrier layers. The total number of the first barrier layers is greater than the total of the second barrier layer(s). According to this construction, the crystallinity can be improved. Therefore, it is possible to provide an efficient nitride group semiconductor light emitting device that has improved light emission efficiency.

In addition, the active region can further include an end barrier layer that is arranged closest to the p-type semiconductor layer. The thickness of the end barrier layer can be greater than the first barrier layers and the second barrier layer(s). According to this construction, it is possible to efficiently diminish crystal defects that may be produced in the barrier layers. Therefore, it is possible to provide a reliable semiconductor device.

In addition, among the thicknesses of the barrier layers that are included in the active region except the end barrier layer, the thicknesses of the barrier layers that are located on the p-type semiconductor layer side can be smaller than the barrier layers that are located on the n-type semiconductor layer side. According to this construction, since the barrier layers have the thus-designed different thicknesses, the resistance component can be reduced. Therefore, the efficiency can be improved.

In addition, two or more sets of the first barrier layers and well layers can be deposited on or above each other. The well layers have composition different from the first barrier layers. The thickness of the first barrier layers can be equal to or greater than twice the thickness of the well layers. According to this construction, it is possible to improve the crystallinity on the n-type semiconductor layer side, which will have high light emission recombination efficiency. Therefore, the light emission efficiency can be further improved.

In addition, two or more sets of the barrier layers and well layers can be deposited on or above each other. The well layers have composition different from the barrier layers. The well layer can be formed of InGaN. The barrier layers can be formed of GaN, InGaN with mixture ratio of In smaller than the well layer, or AlGaN. According to this construction, the barrier layer can diminish crystal defects in the well layer. Therefore, it is possible to provide an efficient light emitting device.

In addition, a cap layer can be sandwiched between each pair of the well layer and the barrier layer in the active region. The cap layer has composition different from the well layer and the barrier layer.

In addition, the cap layer can be formed of AlGaN. According to this construction, the AlGaN cap layer can effectively prevent departure of In from InGaN well layer. Therefore, high light emission efficiency can be maintained.

Additionally, in the nitride semiconductor light emitting device, the p-type semiconductor layer can be deposited on the barrier layer that has the smallest thickness among the thicknesses of the barrier layers that are included in the active region.

DESCRIPTION OF EMBODIMENTS

The following description will describe embodiments according to the present invention with reference to the drawings. It should be appreciated, however, that the embodiments described below are illustrations of a nitride group semiconductor light emitting device used therein to give a concrete form to technical ideas of the invention, and a nitride group semiconductor light emitting device of the invention is not specifically limited to description below. However, it should be appreciated that the members shown in claims attached hereto are not specifically limited to members in the embodiments. Unless otherwise specified, any dimensions, materials, shapes and relative arrangements of the parts described in the embodiments are given as an example and not as a limitation.

Additionally, the sizes and the positional relationships of the members in each of drawings are occasionally shown larger exaggeratingly for ease of explanation. Members same as or similar to those of this invention are attached with the same designation and the same reference signs, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like. Also, the term "on or above" (e.g., on or above a layer) used in the specification is not limited to the state where a member is formed in contact with a layer but occasionally includes the state where a member is formed upward relative to a layer to be spaced away from the layer, in other words, the state where a member is formed to interpose an interposed member between the member and the layer in an inclusive sense.

First Embodiment

Figure 1:
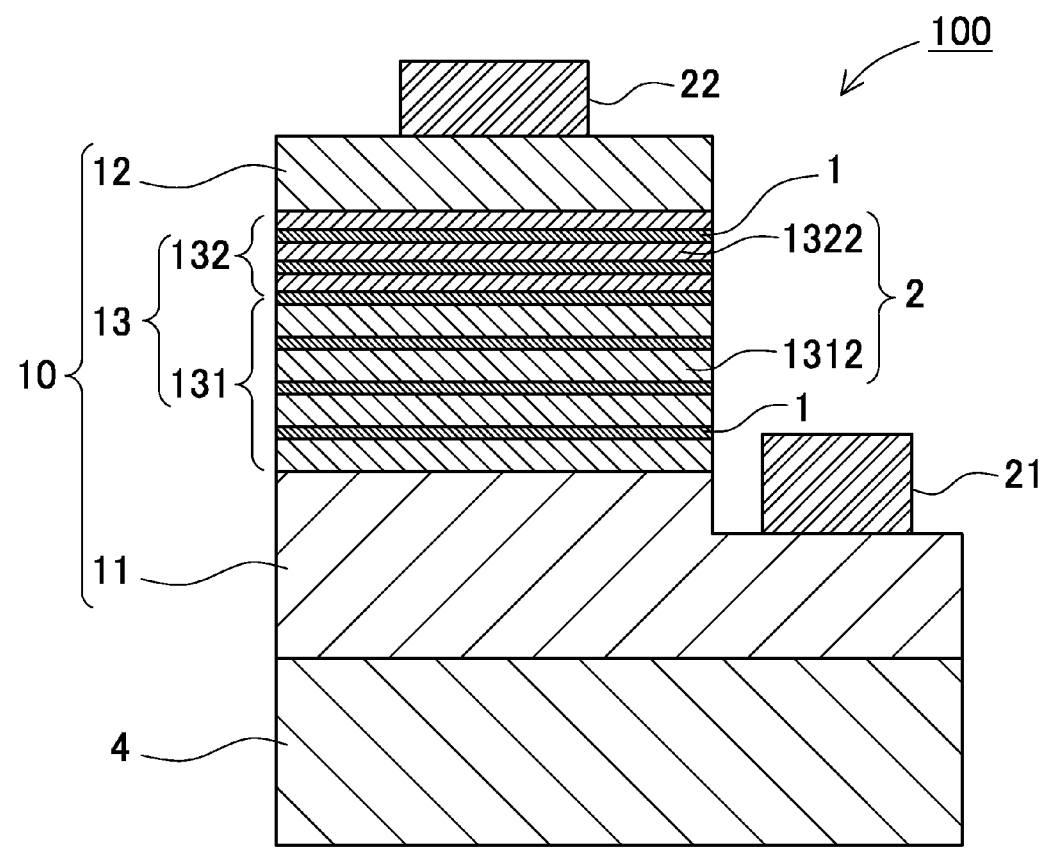
FIG. 1: Schematic cross-sectional view showing the device construction of a light emitting apparatus that includes a nitride group semiconductor light emitting device according to a first embodiment of the present invention.

FIG. 1 is a cross-sectional view schematically showing a nitride group semiconductor light emitting device according to a first embodiment of the present invention. Specifically, FIG. 1 shows the device construction of a light emitting apparatus. A light emitting device 100 shown in FIG. 1 is a nitride group semiconductor light emitting device that includes a substrate 4, and a semiconductor structure 10 that is deposited on or above the substrate 4. The semiconductor structure 10 includes n-type and p-type semiconductor layers 11 and 12, and an active region 13 that is interposed between the n-type and p-type semiconductor layers 11 and 12. That is, the n-type semiconductor layer 11, the active region 13, and the p-type semiconductor layer 12 are deposited on each other in this order on or above the substrate 4, in the light emitting device 100. In addition, the light emitting device 100 includes n-side and p-side electrodes 21 and 22. A part of p-type semiconductor layer 12 is removed so that n-type semiconductor layer 11 is exposed. The n-side electrode 21 is formed on the exposed n-type semiconductor layer 11. The p-side electrode 22 is formed on the main surface of the p-type semiconductor layer 13. When electric power is supplied to the n-type and p-type semiconductor layers 11 and 12 through the n-side and p-side electrodes 21 and 22, respectively, the active region 13 emits light. The p-type semiconductor layer 12 side located in the upper part of the semiconductor structure 10 serves as a main light emission surface side. That is, light mainly outgoes upward in FIG. 1.

The active region 13 includes barrier layers 2 that are included in the multiquantum well structure. The active region 13 shown in FIG. 1 has the multiquantum well structure that includes two or more sets of the barrier layers 2 and well layers 1 are deposited on each other. The well layers 1 have composition different from the barrier layers 2. The barrier layers 2 can include at least a plurality of first barrier layers 1312, and a plurality of second barrier layers 1322. The second barrier layers 1322 are arranged on the p-type semiconductor layer 12 side relative to the first barrier layer 1312, and have a thickness smaller than the first barrier layers 1312. The total number of the first barrier layers 1312 is greater than the total of the second barrier layers 1322.

Also, the active region 13 can include first and second active regions 131 and 132 corresponding to the first and second barrier layers 1312 and 1322, respectively. Specifically, there are two active regions; (1) the first active region 131 of multiquantum well structure that includes two or more sets of first well layers 1311 and the first barrier layers 1312 having composition different from the first well layers, and (2) the second active region 132 of multiquantum well structure that is located on the p-type semiconductor layer 12 side relative to the first active region 131, and includes two or more sets of second well layers 1321 having composition and thickness substantially equal to the first well layers 1311, and the second barrier layers 1322 having composition substantially equal to the first barrier layers 1312 and thickness smaller than the first barrier layers 1312. In addition, the number of sets of well and barrier layers in the first active region is greater than the number of sets of well and barrier layers in the second active region.

(Semiconductor Structure 10)

Figure 2:
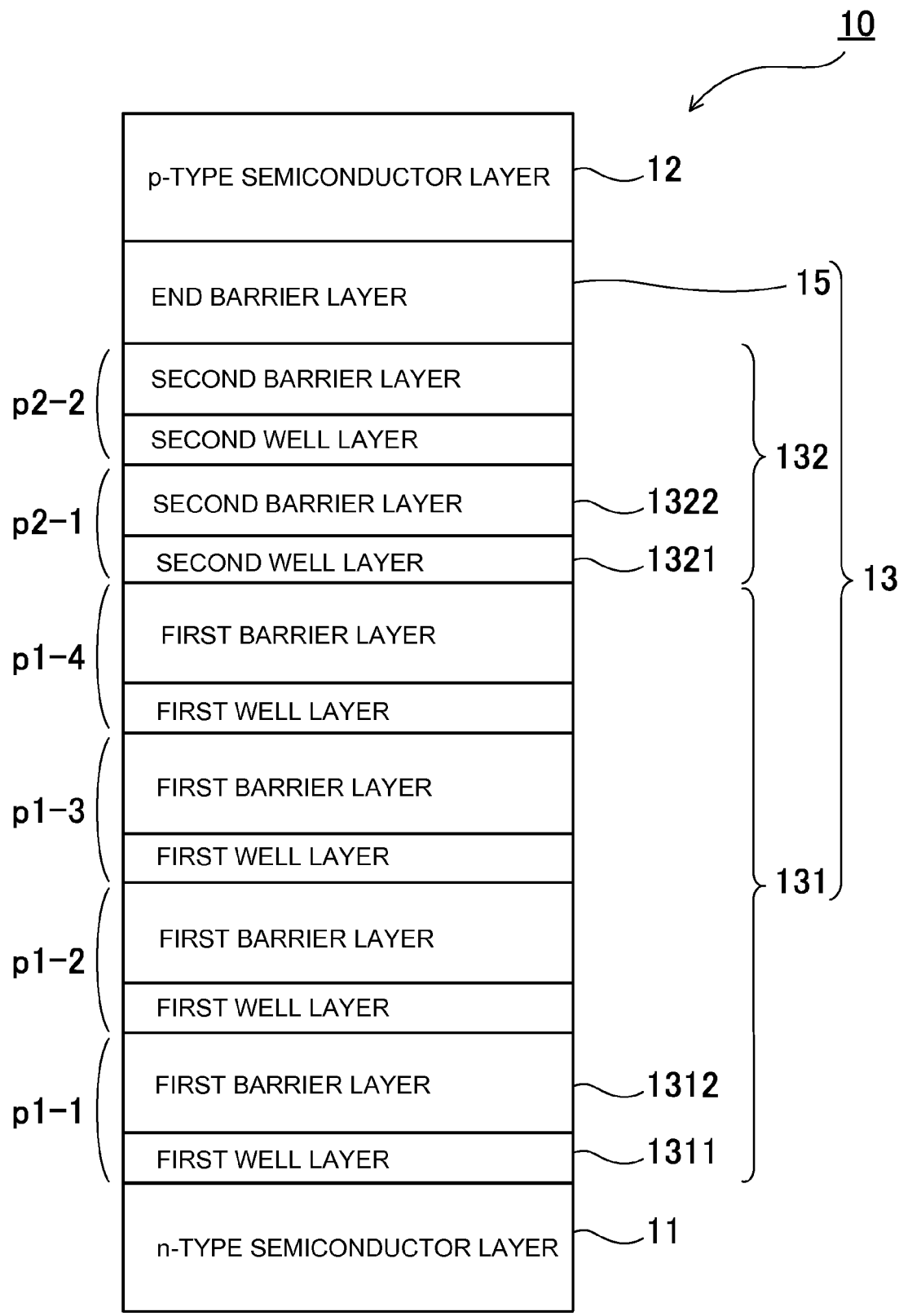
FIG. 2: Schematic cross-sectional view showing the semiconductor construction of the nitride group semiconductor light emitting device shown in FIG. 1.

FIG. 2 is a cross-sectional view showing the construction of the semiconductor structure 10. As shown in this cross-sectional view, the semiconductor structure 10 includes the active region 13 and the p-type semiconductor layer 12, which are deposited on or above the n-type semiconductor layer 11. The active region 13 includes the first active region 131, the second active region 132, and the end barrier layer 15 that are deposited in this order from the n-type semiconductor layer 11 side toward the p-type semiconductor layer 12 side. That is, the end barrier layer 15 is interposed between the multiquantum well structure and the p-type semiconductor layer 12, and is arranged closest to the p-type semiconductor layer 12. The thickness of the end barrier layer 15 is greater than the thicknesses of other barrier layers (i.e., first and second barrier layers 1312 and 1322).

(First and Second Active Regions 131 and 132)

The first or second active regions 131 or 132 of multiquantum well structure includes two or more sets (pairs) of the well layers 1311 or 1321 and the barrier layers 1312 or 1322. The first active region 131 shown in FIG. 2 includes four pairs p1-1, p1-2, p1-3 and p1-4 of the first well and barrier layers 1311 and 1312. The second active region 132 is arranged on the first active region 131. The second active region 132 includes two pairs p2-1 and p2-2 of the second well and barrier layers 1321 and 1322. That is, two pairs of the second well and barrier layers are deposited on each other as shown in FIG. 2. The pairs p1-1, p1-2, p1-3, and p1-4 in the first active region 131 have a thickness substantially equal to each other. The first well layers 1311 in the pairs have a thickness substantially equal to each other. Also, the first barrier layers 1312 have a thickness substantially equal to each other. In addition, the pairs p2-1 and p2-2 in the second active region 132 have a thickness substantially equal to each other. The second well layers 1321 in the pairs have a thickness substantially equal to each other. Also, the second barrier layers 1322 have a thickness substantially equal to each other. In the illustrated embodiment, the first well layer 1311 is arranged on the n-type semiconductor layer 11 side, while the first barrier layer 1312 is deposited on this well layer 1311. However, the layer that is arranged on the n-type semiconductor layer 11 side is not limited to the well layer. The barrier layer may be arranged on the n-type semiconductor layer 11 side.

(Well and Barrier Layers)

The well layer is a semiconductor layer that contains indium in the composition. An InGaN layer is preferably used as the well layer. The barrier layers have composition different from the well layers. As for exemplary composition, the barrier layers can be formed of GaN, InGaN with mixture ratio of In smaller than said well layer, AlGaN, or the like. It is preferable that barrier layers do not contain indium in its composition. A GaN layer is suitable as the barrier layers.

The thickness of the second well layers 1321 of the second active region 132 is equal to the first well layers 1311 of the first active region 131. In the case where the light emitting device includes the well layers in the active region having a thickness substantially equal to each other, the wavelength and color purity of output light can be maintained even. In addition to this, the efficiency can be improved by the barrier layers that have different thicknesses. The thicknesses of the second barrier layers 1322 in the second active region 132 that are located on the p-type semiconductor layer 12 side are smaller than the first barrier layers 1312 in the first active region 131 that are located on the n-type semiconductor layer 11 side. That is, among the thickness of the barrier layers 2 that are included in the active region 13 except the end barrier layer 15, the thickness of the barrier layers that are located on the p-type semiconductor layer 12 side is smaller than the barrier layers that are located on the n-type semiconductor layer 11 side. The average thickness of the last two barrier layers 1322 that are arranged adjacent to the end barrier layer 15 is smaller than the average thickness of the other barrier layers 1312 among the thicknesses of the barrier layers 2 that are included in the multiquantum well structure. Therefore, since the thickness of the first barrier layers 1312 is greater than the second barrier layer 1322, the thickness of each pair p1-1, ... in the first active region 131 is greater than each pair p2-1, ... in the second active region 132. In other words, the average thickness of the barrier layer (last barrier layer) that is located adjacent to the end barrier layer 15, and the barrier layer (second last layer) that is located on the side opposite to the end barrier layer 15 relative to this barrier layer (last barrier layer) and is located next to this barrier layer (last barrier layer) is smaller than the average thickness of the other barrier layers among the thicknesses of the barrier layers that are included in the multiquantum well structure.

The barrier layer serves to provide quantum well effect, and additionally to diminish crystal defects that are produced in the well layer. For example, as shown in FIG. 4, the crystal defects or dislocations in the well layer of InGaN layer will increase as the mixture ratio of In. In particular, when the light emission wavelength is long such as in the green range, for example, it is necessary to increase the mixture ratio of In in the InGaN well layer. In the case where the mixture ratio of In is increased, crystallinity will become worse so that defects will increase. Defects will increase with repetition of layer deposition processes, that is, toward the p-type semiconductor layer side (upper side in FIG. 3, and right side in FIG. 4).

In the construction shown in FIG. 4 where the p-type semiconductor layer 12 is deposited above the n-type semiconductor layer 11, defects or dislocations will increase from the left side toward the right side. To address this, it is conceivable that the GaN barrier layer is deposited thick on the InGaN well layer in order to diminish crystal defects and additionally to prevent that impurities of the p-type semiconductor layer 12 is diffused into the active region and contained in the well layer whereby improving the crystallinity of the active region. However, if the barrier layer becomes thick, the resistance component will increase. Accordingly, there is a problem that the forward voltage upon activation will increase. To solve this problem, the inventor of the present invention has diligently studied, and as a result has found that, even when the thicknesses of the barrier layers on the n-type semiconductor layer 11 side are maintained, the forward voltage can be reduced by reducing the thicknesses of the barrier layers on the p-type semiconductor layer 12 side.

The thickness of the first barrier layer 1312 preferably falls within the ranged of about 1.1 to 2.0 times, more preferably 1.2 to 1.5 times the second barrier layer 1322. According to this, the functions of the active layer can be sufficiently maintained, but the serial resistance component can be suppressed, which in turn can prevent light emission efficiency reduction of the active region. It is preferable that the thicknesses of the first barrier layers 1312 be equal to or greater than twice the thickness of the well layers 1311 and 1132. In the case where the barrier layer is thick, a long wavelength emission spectrum can be efficiently provided. The reason is that good well layers can be formed by using the thick barrier layer that can diminish defects that may be produced by a high indium mixture ratio. In particular, since the barrier layers 1312 on the n-type semiconductor layer 11 side that have high light emission recombination efficiency are thick, it is possible to more remarkably improve light emission efficiency.

(Number of Pairs in Active Region 13)

It is preferable that the number of pairs in the second active region 132 be smaller than the number of pairs in the first active region 131. Specifically, it is preferable that the number of pairs in the first active region 131 be twice or more, more preferably, three times or more the number of pairs in the second active region 132. According to this construction, the functions of the active layer can be sufficiently maintained. In addition, each pair can suppress undesirable increase of the serial resistance component but can serve as a primary layer in the active region so that light emission efficiency reduction of the active region is avoidable.

(Cap Layer)

Figure 3:
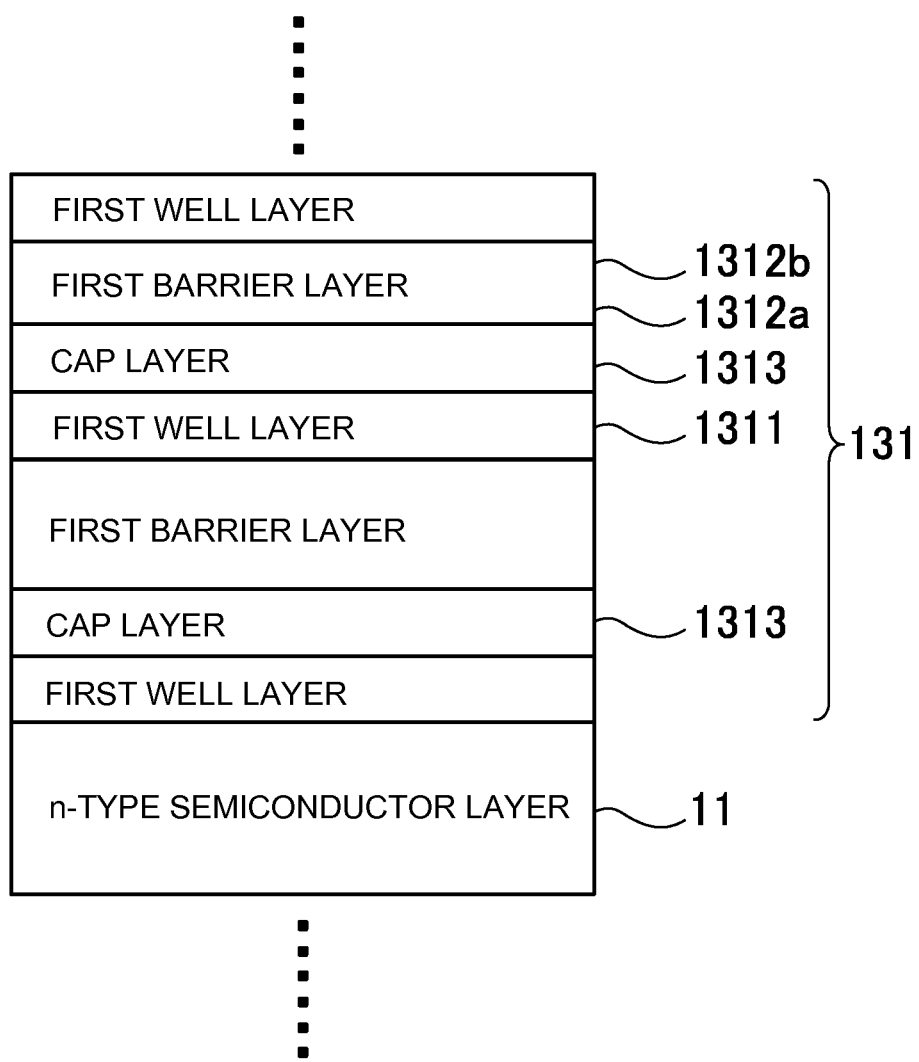
FIG. 3: Schematic cross-sectional view showing exemplary barrier layers.
Figure 4:
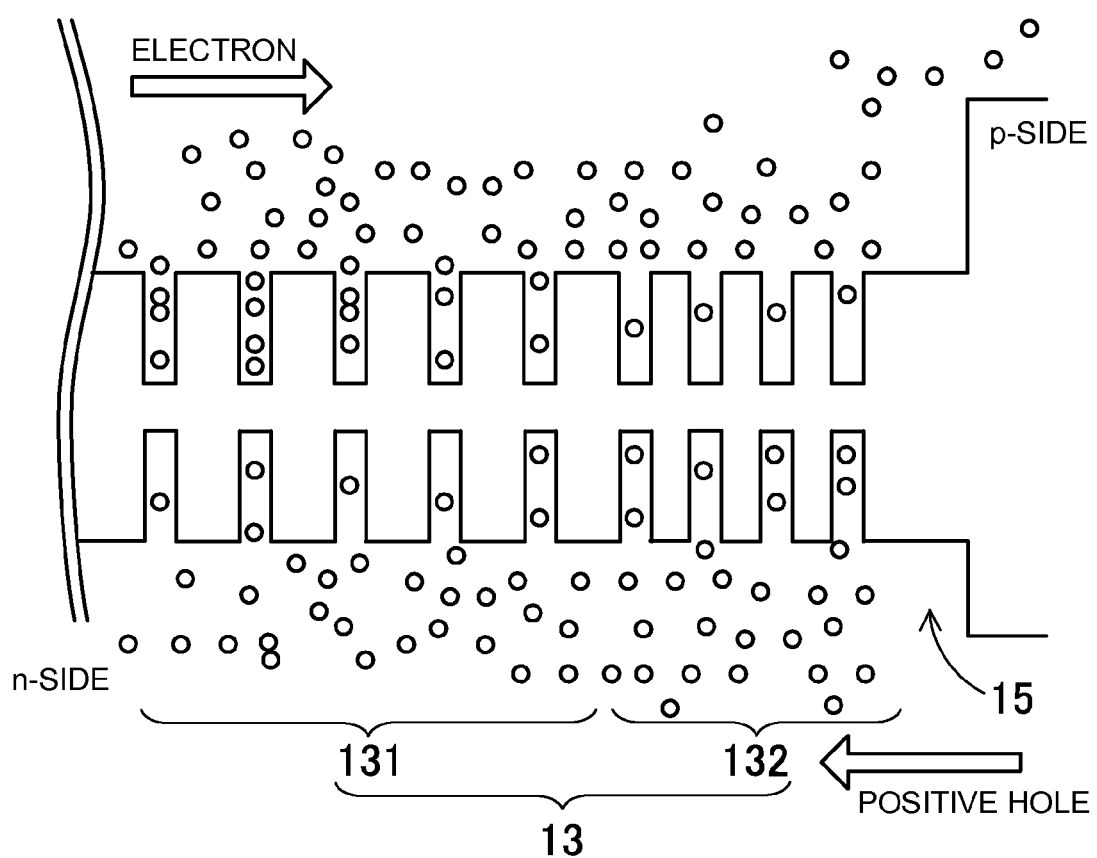
FIG. 4: Schematic view showing movement of electrons and positive holes in an active region of multiquantum well structure that includes well layers and barrier layers.

In addition, it is preferable that a cap layer 1313 that has composition different from the well layer and the barrier layer be interposed between the well layer and the barrier layer, as shown in FIG. 3. The cap layer 1313 serves to prevent departure of indium in composition of the well layer. In the case of InGaN well layer, the cap layer can be an AlGaN layer, for example. In the case where the cap layer 1313 is deposited on and covers the upper surface of the well layer, since departure of indium can be prevented, it is possible to improve light emission efficiency.

(End Barrier Layer)

The thickness of the end barrier layer 15 that is located closest to the p-type semiconductor layer 12 is greater than the first and second barrier layers 1312 and 1322. In particular, since the thickness of the end barrier layer 15 is greater than the second barrier layers 1322, it is possible to efficiently diminish crystal defects that are produced in the second active region 132. Therefore, it is possible to provide a reliable semiconductor device. However, particularly, in the case crystal defects in the active region 13 can be sufficiently diminished by the barrier layers except the end barrier layer 15 so that high light emission recombination efficiency of the active region 13 on the n-type semiconductor layer 11 side can be maintained, the thickness of the end barrier layer 15 may be roughly equal to other barrier layer that is located closest to the end barrier layer 15 (in the illustration of FIG. 2, the second barrier layer 1322 in the pair p2-2 in the second active region 132). Alternatively, the end barrier layer 15 may be omitted so that the p-type semiconductor layer is deposited on the barrier layer that is located at the uppermost position, that is, on the barrier layer that has the thinnest thickness among the barrier layers in the multiquantum well structure of the active region.

Figure 5:
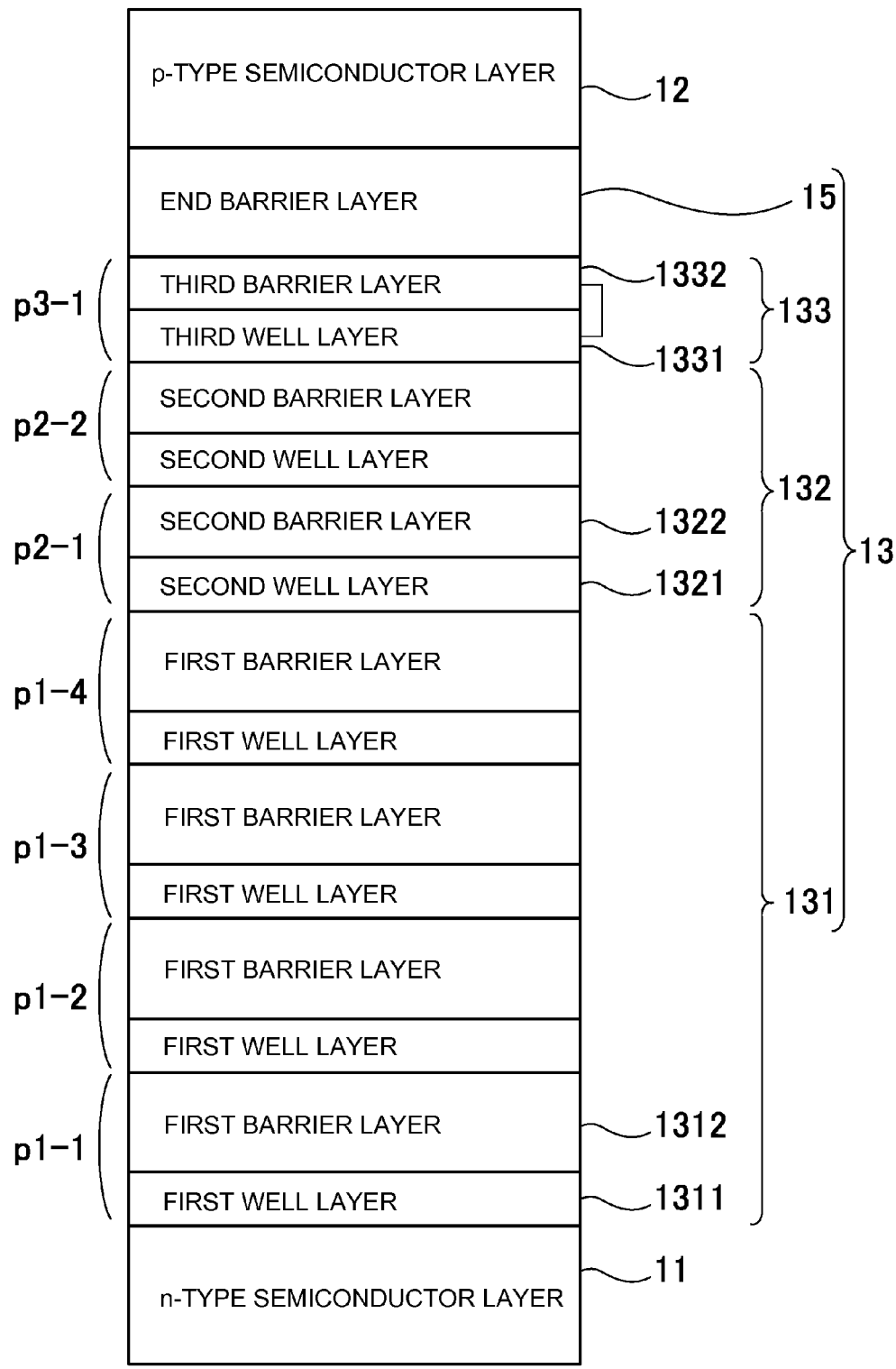
FIG. 5: Schematic cross-sectional view showing the construction of an active region according to a modified embodiment with the active region being classified into three groups.

In the foregoing embodiment, the active region has been described to be classified into two groups of the first and second active regions 131 and 132. However, the present invention is not limited to this. Needless to say, the active region can be classified into not less than three groups. FIG. 5 shows a modified embodiment. The active region 13 according to this modified embodiment is classified into three groups of first, second and third active regions 131, 132 and 133 that are arranged in this order from the n-type semiconductor layer 11 side to the p-type semiconductor layer 12 side. Also, in this construction, the thickness of the well layers in the first, second and third active regions 131, 132 and 133 is the same, while the thicknesses of the barrier layers are dimensioned in the condition of first active region 131>second active region 132>third active region 133. Also, according to this construction, the resistance component can be reduced similar to the foregoing embodiment. As a result, it is possible to reduce the forward voltage. In addition, in the case where the number of the pairs of well and barrier layers is increased, the forward voltage Vf can be reduced, and additionally the light emission efficiency (lumens per watt) can be improved. In this embodiment, in the case where the number of the pairs in each active region is designed in condition of first active region 131>second active region 132>third active region 133, carriers can be uniformly injected to all light emitting areas. As a result, it is possible to improve the light emission efficiency.

Specifically, the active region 13 shown in FIG. 5 includes the third active region 133 in addition to the first and second active regions 131 and 132 shown in FIG. 2. The third active region 133 is deposited on the second active region 132, and includes a pair p3-1 of third well and barrier layers 1331 and 1332. In the foregoing modified embodiment, the barrier layers in each of the first, second and third active regions 131, 132 and 133 have the same thicknesses, while the barrier layer thicknesses in the first, second and third active regions 131, 132 and 133 are changed. However, the thicknesses of the barrier layers may be gradually reduced from the n-type semiconductor layer 11 side to the p-type semiconductor layer 12 side.

(Substrate)

The substrate for growing a semiconductor layer can be a substrate that has composition different from the nitride group semiconductor and has an upper surface on which the nitride group semiconductor can be grown. For example, the material of different-material type substrate can be an electrically-insulating substrate such as sapphire having C-facet, R-facet or A-facet as primary surface or spinel ($MgAl_2O_4$), SiC (6H, 4H, 3C), ZnS, ZnO, GaAs, Si, oxide substrate that is bondable with the nitride semiconductor in a lattice-matching manner, or the like. Sapphire and spinel are suitable as the different-material type substrate.

Off-angle different-material type substrates may be used. In this case, it is preferable that the substrate be an off-angle different-material type substrate that formed in stepped shape. The reason is that a primary layer of gallium nitride having good crystallinity can be grown. In the case where a different-material type substrate is used, before the device structure is formed, after the nitride group semiconductor that serves as the primary layer is grown on the different-material type substrate, the different-material type substrate can be removed by grinding, or the like, so that the device structure can be grown on the nitride group semiconductor from which the different-material type substrate is removed. Also, after the device structure is formed, the different-material type substrate may be removed.

In this embodiment, the sapphire substrate is used as the growth substrate. Other different-material type substrates, for example, substrates other than nitride group semiconductor may be used. Also, a GaN substrate may be used instead of the different-material type substrate.

(Buffer Layer)

In the case where a different-material type substrate is used, the device structure of semiconductor layers is formed with a low-temperature growth layer as a buffer layer and a primary layer of a nitride group semiconductor (e.g., GaN) being interposed between the different-material type substrate and the device structure. In the case where the buffer layer and the primary layer are interposed between the different-material type substrate and the device structure, a nitride group semiconductor having good crystallinity can be grown. The buffer layer or the primary layer may be constructed of only a single layer or, a plurality of layers. In addition, the buffer layer may additionally serve as the primary layer.

(Production Method)

A method for producing a nitride group semiconductor light emitting device according to this embodiment is now described. First, a φ3-inch different-material type substrate of sapphire having C-facet as primary surface is placed in a MOCVD reactor vessel. A buffer layer of $Al_{0.05}Ga_{0.95}N$ with thickness of 250 Å is grown on the substrate at temperature of 500° C. by using TMG (trimethyl gallium), TMA (trimethyl aluminum), and ammonia ($NH_3$). Subsequently, non-doped GaN with thickness of 15000 Å is grown at a higher temperature as a primary layer. The n-type semiconductor layer 11, the active region 13, and the p-type semiconductor layer 12 are deposited in this order as the device structure 10 on or above the primary layer.

First, an n-type contact layer of GaN with thickness of 40000 Å is grown at 1150° C. on the thus-grown primary layer by using TMG and ammonia together with silane gas as impurity gas.

Subsequently, after the temperature is adjusted to 900° C., a first layer of Si-doped $In_{0.05}Ga_{0.95}N$ with thickness of 22 Å by using TMG and ammonia together with silane gas as impurity gas. After that, supply of TMI is stopped so that a second layer of GaN with thickness of 11 Å is grown. These processes are repeated 30 times so that the first layers and the second layers are deposited. Thus, an intermediate layer of multilayers (supperlattice structure) with total thickness 660 Å is grown. In this case, InGaN having In mixture ratio in the range 0.05 to 0.3 can sufficiently serve as a buffer layer.

Thus, the semiconductor light emitting device includes an intermediate layer that contains indium and is arranged between the n-type semiconductor layer and the active region. In the case where the intermediate layer (SLB layer) that contains indium and serves as a buffer layer is arranged between the n-type semiconductor layer and the active region, it is possible to relieve a stress that will be applied to the active layer, and to avoid that an undesired stress is applied to the active layer. Alternatively, a non-doped single layer that contains indium and is deposited at temperature 1000° C. may be used as the intermediate layer. In this case, the non-doped single layer can also sufficiently serve as a buffer layer. In addition, the intermediate layer may be doped with n-type impurities. In this case, the carrier injection efficiency and the amount of carriers can be increased. As a result, it is possible to improve the light emission efficiency, and to reduce Vf. In the case where Si is doped, the resistivity can be reduced. Accordingly, a buffer layer with low resistance can be formed.

In the case where the active region structure of one set of repetitive layers (discussed later) includes total three or more layers of a well layer that contains indium, a barrier layer that has composition different from the well layer, and a cap layer that has composition different from the well and barrier layers, the intermediate layer may be omitted.

Subsequently, after the temperature is adjusted to 900° C., an Si-doped GaN layer with thickness 40 Å is deposited by using TMG as material gas. After that, a non-doped GaN layer with thickness 20 Å is deposited on this Si-doped GaN layer.

After the n-type semiconductor layer 11 is formed as discussed above, semiconductor layers including the well and barrier layers are formed as the active region 13. For example, the well layer contains indium in the composition, while the barrier layer does not contain indium in the composition. Specifically, two or more sets of well layers of non-doped $In_{0.57}Ga_{0.43}N$ and barrier layers of GaN are deposited one after another so that barrier layer/well layer/barrier layer/well layer/barrier layer . . . are arranged. The thicknesses of the barrier layers on the p-type semiconductor layer side (the second barrier layers in the second active region) are smaller than the barrier layer on the n-type semiconductor layer side (the first barrier layers in the first active region). In addition, other barrier that has composition different from the well and barrier layers may be sandwiched between the well and barrier layers. Thus, the multiquantum well structure (MQW) is constructed. Additionally, the end barrier layer 15 of GaN can be formed closest to the p-type semiconductor layer.

Subsequently, the p-type semiconductor layer 12 is formed. The p-type semiconductor layer 12 can include a layer that has the same composition as the barrier layer. Particularly, in the case where the p-type semiconductor layer has composition of AlGaN, the band gap difference between the p-type semiconductor layer and the well layer of InGaN is greater than the band gap difference between the well layer of InGaN and the barrier layer of GaN. As a result, carrier overflow is suppressed so that carriers can be efficiently confined. Therefore, it is possible to improve the light emission recombination efficiency. Specifically, after the temperature is adjusted to 1050° C., an electron-confinement layer of $Al_{0.3}Ga_{0.7}N$ doped with Mg of $1 \times 10^{19}/cm^3$ and thickness of 150 Å is grown by using TMA, TMG and ammonia as material gas, and $Cp_2Mg$ (cyclopentadienyl magnesium) as impurity gas. In the case where the electron-confinement layer is provided, electrons as carriers are confined. As a result, it is possible to provide high output power. It is noted that the electron-confinement layer may be omitted.

In the case where the active region structure of one set of repetitive layers includes total three or more layers of a well layer that contains indium, a barrier layer that has composition different from the well layer, and a cap layer that has composition different from the well and barrier layers, when the Mg-doped GaN layer is formed, it is also possible to provide high output power.

Subsequently, a non-doped GaN layer with thickness of 2000 Å is grown at the same temperature by using TMG and ammonia as material gas.

In addition, a p-type low-doped contact layer of GaN with Mg of $1\times10^{20}/cm^3$ and thickness of 1000 Å is grown at the same temperature on the non-doped GaN layer. The p-type low-doped contact layer may be formed of $In_xAl_yGa_{1-x-y}N$ ($0\leq x$, $0\leq y$, $x+y\leq 1$). It is preferable that the p-type low-doped contact layer be formed of Mg-doped GaN. The reason is that the p-type low-doped contact layer can have low resistance.

Finally, a p-type contact layer of GaN with Mg of $1\times10^{20}/cm^3$ and thickness of 150 Å is grown at the same temperature on the p-type low-doped contact layer. The p-type contact layer may be formed of $In_xAl_yGa_{1-x-y}N$ ($0\leq x$, $0\leq y$, $x+y\leq 1$). It is preferable that the p-type contact layer be an Mg-doped GaN layer. The reason is that the Mg-doped GaN layer can be in good ohmic contact with the p-side electrode. Since the electrode is formed on the contact layer, the contact layer preferably has a high carrier concentration of not smaller than $1\times10^{17}/cm^3$. If the carrier concentration of the contact layer is smaller than $1\times10^{17}/cm^3$, the contact layer is less likely to be in good ohmic contact with the electrode. In the case where the composition of the contact layer is GaN, the contact layer is likely to be in good ohmic contact with the electrode material. After the reaction is completed, the wafer is annealed at 700° C. under a nitrogen atmosphere in a reaction vessel to further reduce the resistances of the p-type semiconductor layers.

The semiconductor light emitting device 100 can emit light with the peak of the light emission spectrum corresponding to the well layer. In the case where the nitride semiconductor light emitting device 100 according to the embodiment is produced by the aforementioned production method, the wavelength of output light can be not longer than 530 nm. Accordingly, in the case of a long wavelength nitride group semiconductor light emitting device such as a green range or amber range semiconductor light emitting device that includes well layers the mixture ratio of which is high, although crystallinity is likely to be worse in conventional semiconductor light emitting devices, the present invention can suitably improve the light emission efficiency.

(Comparative Test 1)

Figure 6:
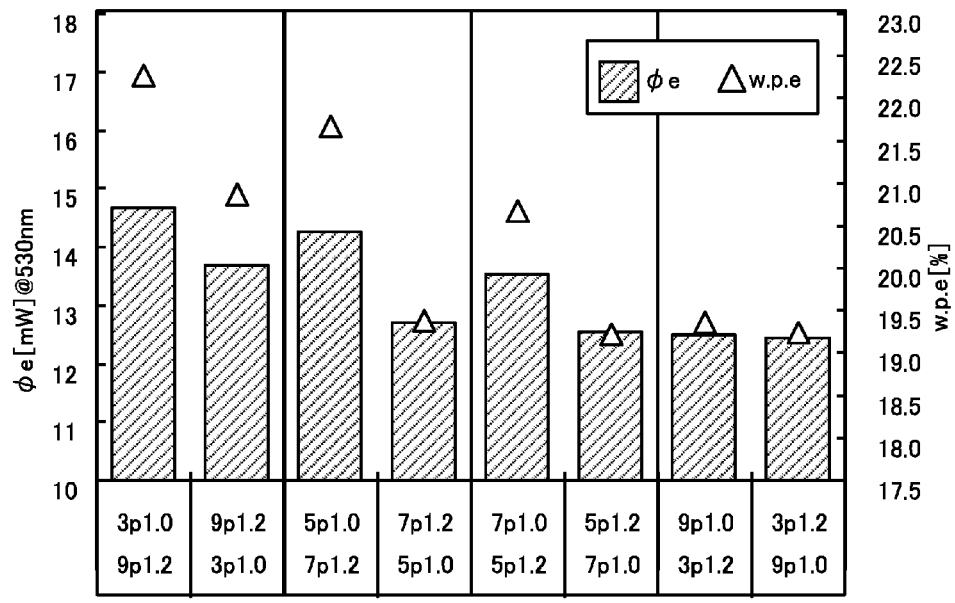
FIG. 6: Graph showing the result of comparative test 1.

To evaluate the effectiveness of the construction of present invention, a test is performed by using the nitride group semiconductor light emitting device that is produced as discussed above. Specifically, on the condition that the nitride group semiconductor light emitting device that has the semiconductor layer structure shown in FIG. 2 is mounted to a φ5 type bullet lamp, the light emission intensity (φe) and light emission efficiency (W/φe) are measured. More specifically, the semiconductor layer structure includes the active region that includes 12 pairs of well and barrier layers. The thicknesses of the first barrier layer and the second barrier layer 1322 are changed. The ratio between the number of first barrier layer pairs and the number of second barrier layer 1322 pair(s) is changed. The thickness of the well layer is approximately 30 Å. The thickness of the first barrier layer 1312 including the cap layer is approximately 150 Å. The thickness of the second barrier layer 1322 including the cap layer is approximately 100 Å. No phosphor is included. As for measurement conditions, the current value is approximately 20 mA. The number of samples is five for each condition. An integrating-sphere photometer is used at ordinary temperature as measurement environment. FIG. 6 is a graph showing the test result. As shown in this graph, in the case where the second barrier layers 1322 on the p-type semiconductor layer 12 side is thinner than the first barrier layers 1312 at the n-type semiconductor layer 11 side, the light emission intensity and light emission efficiency are higher. Also, it can be found that, even in the case where the total number of the pairs is fixed, when the number of the second barrier layers 1322 pairs on the p-type semiconductor layer 12 side is smaller than the number of the first barrier layers 1312 pairs on the n-type semiconductor layer 11 side, the light emission intensity and light emission efficiency are higher. In particular, the light emission intensity and light emission efficiency are higher in the pair ratio (first barrier layer 1312: second barrier layer 1322) of 9:3 than in the pair ratio of 7:5. It can be found that the effect can be increased with the difference between the first and second barrier layer pairs.

(Comparative Test 2)

Figure 7:
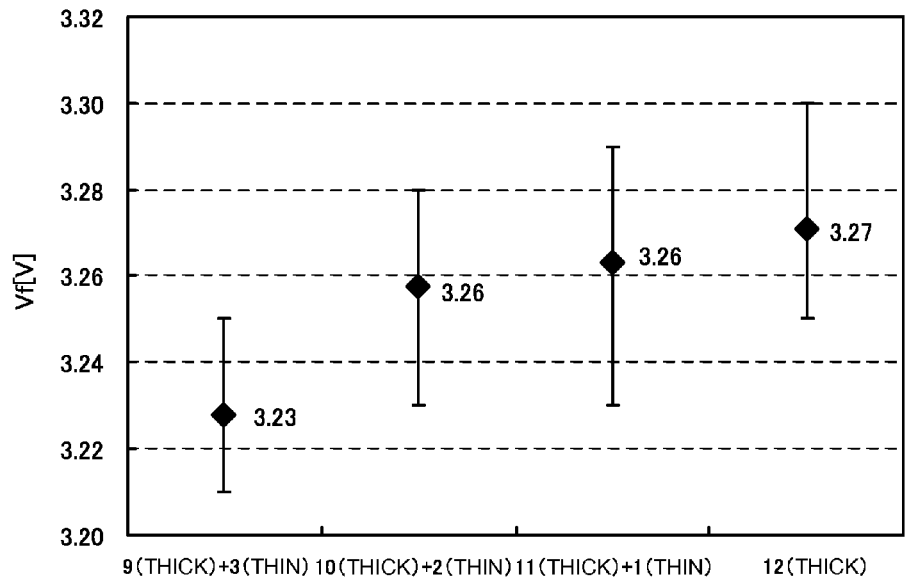
FIG. 7: Graph showing the result of comparative test 2.

In addition, to evaluate the reduction amount of forward voltage Vf in accordance with the number of the second barrier layer 1322 pairs, a test is performed on the condition that the number of the second barrier layer 1322 pairs is changed. FIG. 7 is a graph showing the test result. As shown in this graph, it can be found that, as the number of the second barrier layer 1322 pairs is increased from zero, the forward voltage is likely to be reduced. Particularly, it can be found that, in the case where the number of the second barrier layer 1322 pairs is three or more, the forward voltage is remarkably reduced.

As discussed above, it can be found that, when the construction of the present invention is adopted, the forward voltage can be reduced, and additionally the light emission efficiency can be improved. As a result, the effectiveness of the present invention can be confirmed.

INDUSTRIAL APPLICABILITY

A nitride group semiconductor light emitting device, a light emitting apparatus that includes this nitride group semiconductor light emitting device, and a method for producing this nitride group semiconductor light emitting device according to the present invention can be applied to a light source for lighting, a light emitting device, an LED display that includes nitride group semiconductor light emitting devices arranged in a matrix shape, a back light source, a signal light, an illuminated switch, various sensors such as image scanner, and various indicators, and the like.

The invention claimed is:

1. A nitride group semiconductor light emitting device comprising:
    a substrate,
    n-type and p-type semiconductor layers that are formed on or above said substrate, and
    an active region that is interposed between the n-type and p-type semiconductor layers,
    wherein said active region includes well layers and barrier layers that are included in a multiquantum well structure,
    wherein said barrier layers include at least first barrier layers each of which has substantially the same thickness, and second barrier layers that are arranged on the p-type semiconductor layer side relative to said first barrier layer, each of the second barrier layers having substantially the same thickness which is smaller than that of said first barrier layers,
    wherein the total number of said first barrier layers is greater than the total of said second barrier layers.

2. The nitride group semiconductor light emitting device according to claim 1, wherein said active region further includes an end barrier layer that is arranged closest to said p-type semiconductor layer, wherein the thickness of said end barrier layer is greater than said first barrier layers and said second barrier layers.

3. The nitride group semiconductor light emitting device according to claim 2, wherein among the thicknesses of the barrier layers that are included in said active region except said end barrier layer, the thicknesses of the barrier layers that are located on the p-type semiconductor layer side are smaller than the barrier layers that are located on the n-type semiconductor layer side.

4. The nitride group semiconductor light emitting device according to claim 1, wherein two or more sets of said first barrier layers and well layers are deposited on or above each other, the well layers having composition different from said first barrier layers,
wherein the thickness of said first barrier layers is equal to or greater than twice the thickness of said well layers.

5. The nitride group semiconductor light emitting device according to claim 1, wherein two or more sets of said barrier layers and well layers are deposited on or above each other, the well layers having composition different from said barrier layers,
wherein said well layer is formed of InGaN,
wherein said barrier layers are formed of GaN, InGaN with mixture ratio of In smaller than said well layer, or AlGaN.

6. The nitride group semiconductor light emitting device according to claim 5, wherein a cap layer is sandwiched between each pair of the well layer and the barrier layer in said active region, the cap layer having composition different from said well layer and the barrier layer.

7. The nitride group semiconductor light emitting device according to claim 6, wherein said cap layer is formed of AlGaN.

8. The nitride group semiconductor light emitting device according to claim 1, wherein said p-type semiconductor layer is deposited on the barrier layer that has the smallest thickness among the thicknesses of the barrier layers that are included in said active region.

9. The nitride group semiconductor light emitting device according to claim 1, wherein the number of said second barrier layers is six.

10. The nitride group semiconductor light emitting device according to claim 9, wherein the number of said first barrier layers is 18.

11. The nitride group semiconductor light emitting device according to claim 1, wherein the thickness of said first barrier layers is about 1.1 to 2.0 times of the thickness of said second barrier layers.

12. The nitride group semiconductor light emitting device according to claim 1, wherein the number of said first barrier layers is twice or more than that of said second barrier layers.

13. The nitride group semiconductor light emitting device according to claim 1, wherein said active region includes a well layer adjacent to said first barrier layers and a well layer adjacent to said second barrier layers which thickness is substantially the same as the one of said first barrier layers.

14. The nitride group semiconductor light emitting device according to claim 1, wherein said p-type semiconductor layers includes Mg-doped AlGaN layer deposited on said active region.

* * * * *